US011050244B2

(12) United States Patent
Wang et al.

(10) Patent No.: US 11,050,244 B2
(45) Date of Patent: Jun. 29, 2021

(54) TRANSIENT VOLTAGE DETECTION TECHNIQUE

(71) Applicant: QUALCOMM Incorporated, San Diego, CA (US)

(72) Inventors: Yikai Wang, San Diego, CA (US); Joseph Rutkowski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 390 days.

(21) Appl. No.: 15/962,524

(22) Filed: Apr. 25, 2018

(65) Prior Publication Data

US 2019/0334345 A1 Oct. 31, 2019

(51) Int. Cl.
*H02H 9/04* (2006.01)
*H03K 17/22* (2006.01)
*H03F 1/30* (2006.01)
*G01R 19/165* (2006.01)
*H03K 5/06* (2006.01)

(52) U.S. Cl.
CPC ......... *H02H 9/04* (2013.01); *G01R 19/16552* (2013.01); *H03F 1/30* (2013.01); *H03K 5/06* (2013.01); *H03K 17/223* (2013.01)

(58) Field of Classification Search
None
See application file for complete search history.

(56) References Cited

U.S. PATENT DOCUMENTS

| 7,015,732 | B1 | 3/2006 | Holloway et al. | |
|---|---|---|---|---|
| 8,514,024 | B2 | 8/2013 | Wang et al. | |
| 8,922,418 | B2 | 12/2014 | Elsayed et al. | |
| 9,148,596 | B1 | 9/2015 | Sun et al. | |
| 2009/0082691 | A1 | 3/2009 | Denison et al. | |
| 2011/0121806 | A1* | 5/2011 | Garrett ................ | H02M 3/156 323/282 |
| 2015/0155782 | A1* | 6/2015 | Saby ................ | H02M 3/1588 323/271 |
| 2016/0006337 | A1* | 1/2016 | Thalheim ............ | H01F 27/2823 363/21.05 |
| 2016/0178671 | A1* | 6/2016 | Chen ................ | H02M 3/33507 324/537 |
| 2016/0359422 | A1* | 12/2016 | Yuan ................ | H02M 1/36 |
| 2019/0274197 | A1* | 9/2019 | Chang ................ | H02M 1/36 |

* cited by examiner

*Primary Examiner* — Jeffrey A Gblende
(74) *Attorney, Agent, or Firm* — Qualcomm Incorporated (57) ABSTRACT

Certain aspects of the present disclosure provide a voltage transient detection circuit. The circuit generally includes a first switch having a first terminal coupled to an input signal source node, and a second switch having a first terminal coupled to the input signal source node. The apparatus includes a first shunt capacitive element coupled to a second terminal of the first switch, a second shunt capacitive element coupled to a second terminal of the second switch, a differential circuit having a first input coupled to the second terminal of the first switch, a second input coupled to the second terminal of the second switch, and an output coupled to an output node of the voltage transient detection circuit. For certain aspects, the apparatus also includes a first current source (selectively) coupled to the first shunt capacitive element and a second current source (selectively) coupled to the second shunt capacitive element.

26 Claims, 6 Drawing Sheets

TRANSIENT VOLTAGE DETECTION TECHNIQUE

TECHNICAL FIELD

Certain aspects of the present disclosure generally relate to electronic circuits and, more particularly, to a circuit for transient voltage detection.

BACKGROUND

Power management integrated circuits (power management ICs or PMICs) are used for managing the power requirement of a host system. A PMIC may be used in battery-operated devices, such as mobile phones, tablets, laptops, wearables, etc., to control the flow and direction of electrical power in the devices. The PMIC may perform a variety of functions for the device such as direct current (DC)-to-DC conversion, battery charging, power-source selection, voltage scaling, power sequencing, etc. For example, a PMIC may feature a switched-mode power supply (SMPS) for regulating a DC voltage.

SUMMARY

Certain aspects of the present disclosure generally relate to techniques and apparatus for voltage transient detection.

Certain aspects of the present disclosure provide a voltage transient detection circuit. The circuit generally includes a first switch having a first terminal coupled to an input signal source node; a second switch having a first terminal coupled to the input signal source node; a first shunt capacitive element coupled to a second terminal of the first switch; a second shunt capacitive element coupled to a second terminal of the second switch; and a differential circuit having a first input coupled to the second terminal of the first switch, a second input coupled to the second terminal of the second switch, and an output coupled to an output node of the voltage transient detection circuit.

Certain aspects of the present disclosure provide a method for voltage transient detection. The method generally includes sourcing a first current from a input signal source node to a first capacitive element if a voltage at the input signal source node is greater than a voltage across the first capacitive element; sourcing a second current from a second capacitive element to the input signal source node if the voltage at the input signal source node is less than a voltage across the second capacitive element; and determining a voltage difference between the voltages across the first capacitive element and the second capacitive element.

Certain aspects of the present disclosure provide an apparatus for voltage transient detection. The apparatus generally includes means for sourcing a first current from a input signal source node to a first capacitive element if a voltage at the input signal source node is greater than a voltage across the first capacitive element, means for sourcing a second current from a second capacitive element to the input signal source node if the voltage at the input signal source node is less than a voltage across the second capacitive element, and means for determining a voltage difference between the voltages across the first capacitive element and the second capacitive element.

Certain aspects of the present disclosure provide a voltage regulation circuit. The voltage regulation circuit generally includes a voltage regulator having an input coupled to a voltage supply, a post-regulation power stage coupled to an output of the voltage regulator, and an envelope detector configured to selectively enable the post-regulation power stage based on a detected envelope of a voltage of the voltage supply.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Wireless Device

Figure 1:
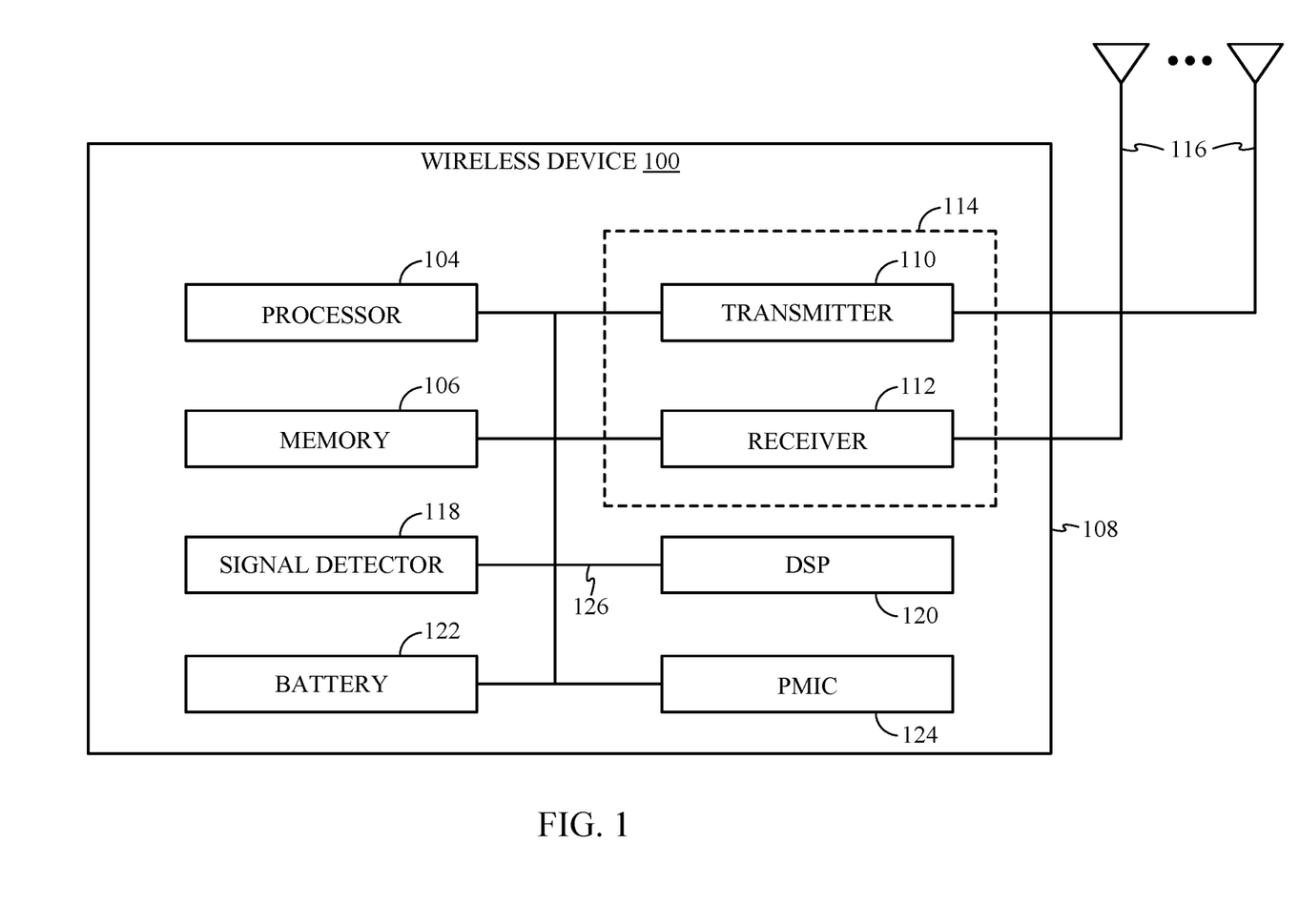
FIG. 1 is a block diagram of an example wireless device including a voltage regulator, according to certain aspects of the present disclosure.

FIG. 1 illustrates an example wireless device 100. The wireless device 100 may be a battery-operated device such as a cellular phone, a personal digital assistant (PDA), a handheld device, a wireless modem, a laptop computer, a tablet, a personal computer, etc. The wireless device 100 is an example of a device that may be configured to implement the various systems and methods described herein. However, the aspects described herein may be implemented in any other suitable electronic device.

The wireless device 100 may include a processor 104 that controls operation of the wireless device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106. The instructions in the memory 106 may be executable to implement the methods described herein.

The wireless device 100 may also include a housing 108 that may include a transmitter 110 and a receiver 112 to allow transmission and reception of data between the wireless device 100 and a remote location. The transmitter 110 and receiver 112 may be combined into a transceiver 114. A plurality of antennas 116 may be attached to the housing 108 and electrically coupled to the transceiver 114. The wireless device 100 may also include (not shown) multiple transmitters, multiple receivers, and multiple transceivers.

The wireless device 100 may also include a signal detector 118 that may be used in an effort to detect and quantify the level of signals received by the transceiver 114. The signal detector 118 may detect such signals as total energy, energy per subcarrier per symbol, power spectral density and other signals. The wireless device 100 may also include a digital signal processor (DSP) 120 for use in processing signals.

The wireless device 100 may further include a battery 122 used to power the various components of the wireless device 100. The wireless device 100 may also include a power management integrated circuit (power management IC or PMIC) 124 for managing the power from the battery to the various components of the wireless device 100. The PMIC 124 may perform a variety of functions for the device such as DC-to-DC conversion, battery charging, power-source selection, voltage scaling, power sequencing, etc. In certain aspects, the DC-to-DC converter of the PMIC 124 may be implemented as a switched-mode power supply (SMPS) having a post-regulation power stage enabled via an envelope detector, as will be described in more detail herein.

The various components of the wireless device 100 may be coupled together by a bus system 126, which may include a power bus, a control signal bus, and a status signal bus in addition to a data bus.

Example Techniques for Transient Voltage Detection

As presented above, the PMIC 124 may perform a variety of functions such as voltage regulation, which may be implemented using a switched-mode power supply (SMPS). For example, the SMPS may be a boost converter for regulating the voltage of a battery (e.g., the battery 122). Some components powered by the PMIC 124 may be sensitive to instability of the voltage supply generated by the PMIC 124. For example, the PMIC 124 may be used to power an active-matrix organic light-emitting diode (AMOLED) panel for the wireless device 100, which is sensitive to instability of the voltage supply. For instance, a 15 mV peak-to-peak transient may cause banding on the screen of an AMOLED panel. Thus, what is needed are circuits and techniques for providing a more stable supply voltage.

Figure 2:
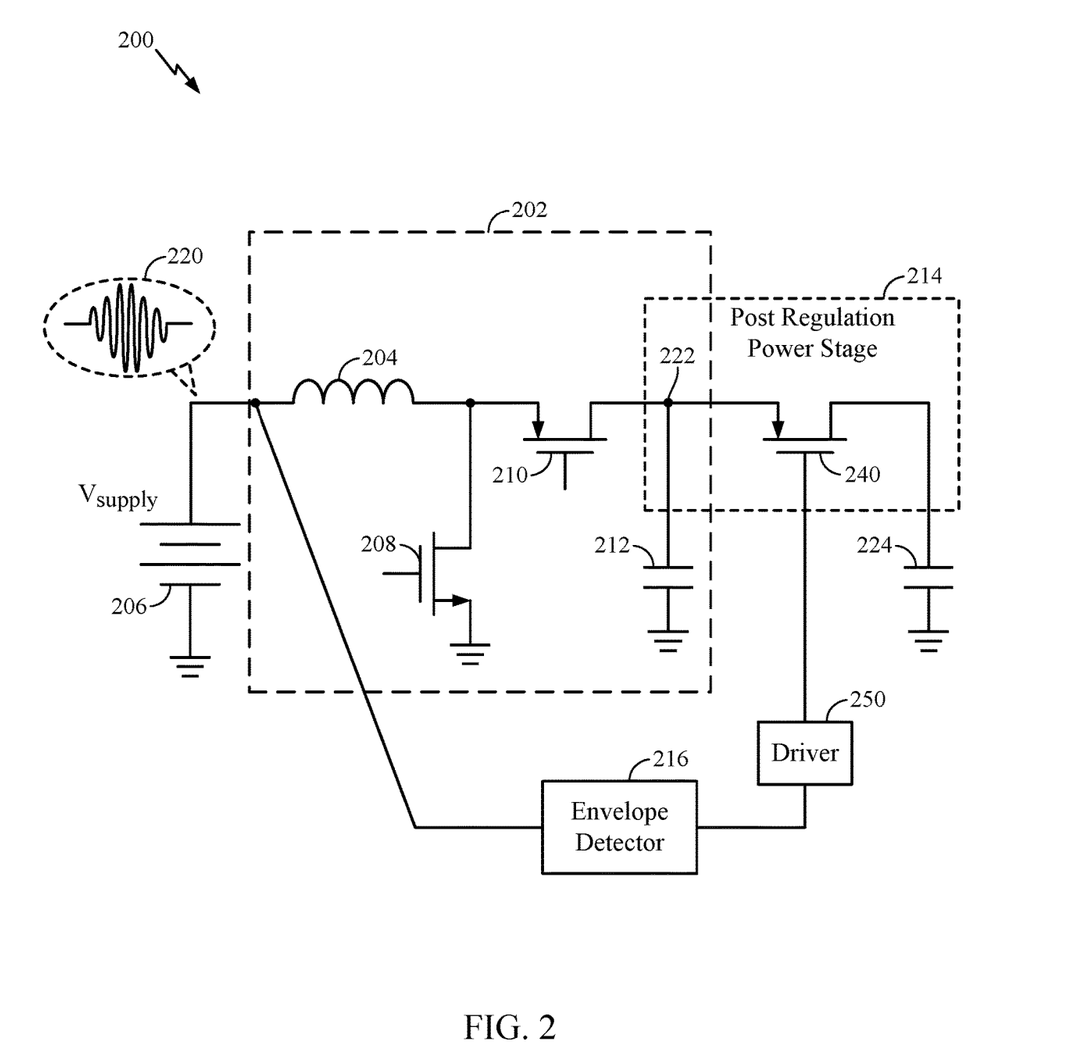
FIG. 2 illustrates an example voltage regulation circuit, in accordance with certain aspects of the present disclosure.

FIG. 2 illustrates an example voltage regulation circuit 200, in accordance with certain aspects of the present disclosure. The voltage regulation circuit 200 (also referred to as a voltage regulator circuit) includes a SMPS 202 implemented as a boost converter. The SMPS 202 includes an inductor 204 coupled to an input signal source 206 (e.g., a voltage supply, which may also be referred to as a voltage source, a power supply, a power source, a signal supply, or a signal source). For example, the input signal source 206 may be a battery, or a power source from a wireless charging circuit for the wireless device 100. The inductor 204 is coupled to a switch 208 and a switch 210. During a first interval, the switch 208 is closed and the switch 210 is open, coupling the inductor 204 between the input signal source 206 and a reference potential (e.g., electric ground) to charge the inductor 204. During a second interval, the switch 208 is opened and the switch 210 is closed, coupling the inductor 204 to an output node 222 of the SMPS 202 to transfer the charge from the inductor 204 to the capacitor 212 coupled to the output node 222. The first and second intervals are controlled via a pulse-width modulated (PWM) signal, the duty cycle of which may be controlled to regulate the voltage across the capacitor 212.

In certain aspects, the input signal source 206 may experience a voltage transient 220, as illustrated. Depending on the power supply rejection ratio (PSRR) of the SMPS 202, the voltage transient 220 may cause a corresponding transient at the output node 222. As presented above, certain components, such as an AMOLED panel, may be sensitive to instability of the input signal source, including such voltage transients.

In certain aspects, a post-regulation power stage 214 may be coupled between the output node 222 and another capacitor 224 to attenuate any such transients and improve the PSRR of the voltage regulation circuit 200. For example, the post-regulation power stage 214 may include a p-type metal-oxide-semiconductor (PMOS) transistor having a source coupled to the output node 222, a drain coupled to the capacitor 224, and a gate coupled to an output of a gate driver circuit 250, as illustrated. However, while the post-regulation power stage 214 improves the PSRR of the voltage regulation circuit 200, the post-regulation power stage 214 also increases the power consumption of the voltage regulation circuit 200 when enabled.

Certain aspects of the present disclosure are generally directed to detecting the voltage transient 220 and selectively enabling the post-regulation power stage 214 when the voltage transient 220 is detected. For example, when a power supply signal (Vsupply) used to provide power to the SMPS 202 experiences a voltage transient, the post-regulation power stage 214 may be enabled to enhance the PSRR of the voltage regulation circuit 200. The voltage transient may be detected via an envelope detector 216, which may be also referred to as a voltage transient detection circuit, the output of which controls the post-regulation power stage 214, as illustrated.

Figure 3:
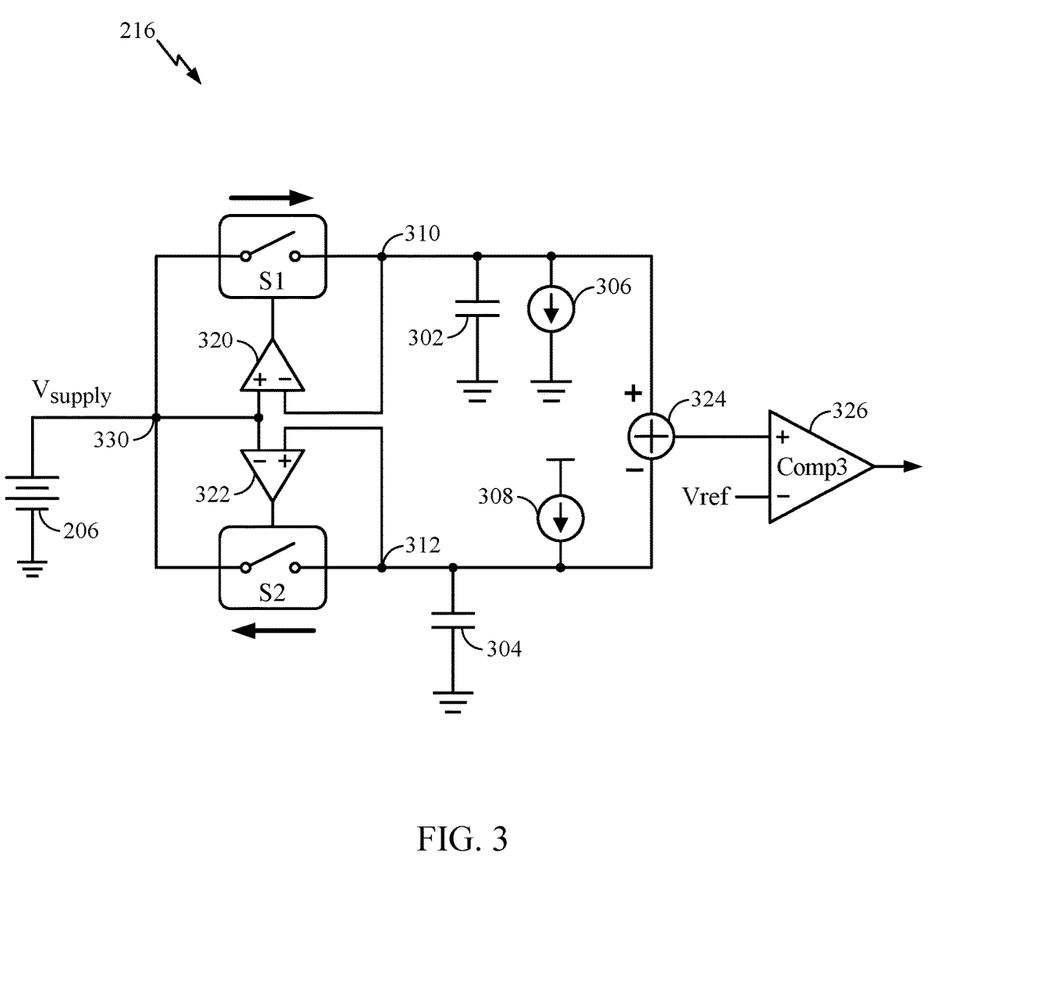
FIG. 3 illustrates an example implementation of an envelope detector, in accordance with certain aspects of the present disclosure.

FIG. 3 illustrates an example implementation of the envelope detector 216, in accordance with certain aspects of the present disclosure. The envelope detector 216 includes switches S1 and S2 between the input signal source 206 and respective capacitors 302 and 304. The switches S1 and S2 may be effectively unidirectional, as will be described below. Each of the capacitors 302 and 304 may represent a set of one or more capacitive elements arranged in series and/or in parallel with one another. The envelope detector 216 also includes a current source 306 for sinking a current from the capacitor 302 and a current source 308 for sourcing a current to the capacitor 304.

In certain aspects, the switch S1 may be closed when $V_{supply}$ is greater than the voltage at node 310, and the switch S2 may be closed when the voltage at node 312 is greater than $V_{supply}$ (i.e., $V_{supply}$ is more negative than the voltage at node 312). For example, the envelope detector 216 may include an amplifier 320 (e.g., a comparator) having a negative input terminal coupled to the node 310 and a positive input terminal coupled to the input signal source 206, as illustrated. The output terminal of the amplifier 320 is coupled to a control terminal of the switch S1 and controls the switch S1 such that when $V_{supply}$ is greater than the voltage at node 310, the switch S1 closes. Moreover, the envelope detector 216 may include an amplifier 322 having a positive input terminal coupled to the node 312 and a negative input terminal coupled to the input signal source 206, as illustrated. The output terminal of the amplifier 322 is coupled to a control terminal of the switch S2 and controls the switch S2 such that when the voltage at node 312 is greater than $V_{supply}$, the switch S2 closes. In this manner, the switches S1 and S2 may effectively function as unidirectional switches, allowing current to flow only in one direction as illustrated in FIG. 3. With such unidirectional switches, the voltage at node 310 may represent the peak of a fluctuation on the supply voltage $V_{supply}$, and the voltage at node 312 may represent a valley of the fluctuation on the supply voltage $V_{supply}$, as described in more detail with respect to FIG. 4.

Figure 4:
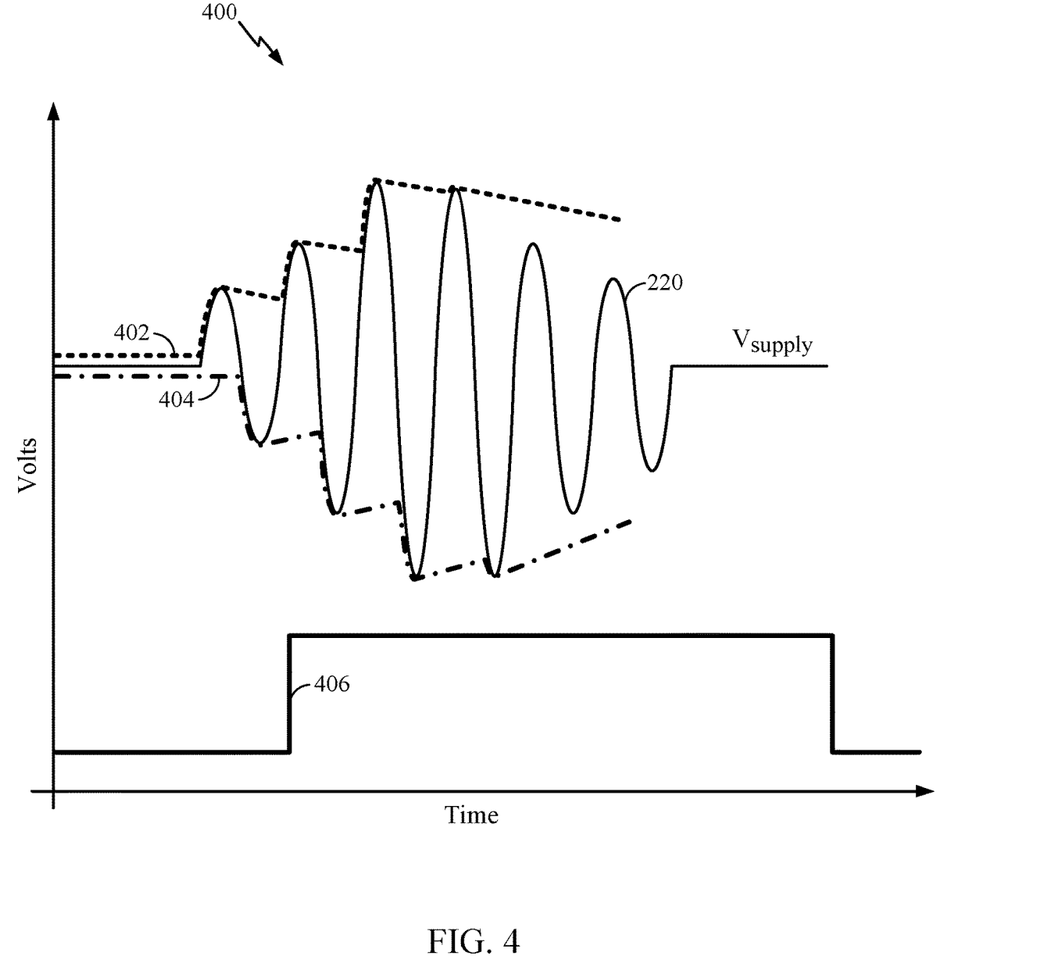
FIG. 4 is a graph illustrating a voltage fluctuation and peak and valley detection voltages of the voltage fluctuation, in accordance with certain aspects of the present disclosure.

FIG. 4 is a graph 400 illustrating a voltage transient 220, a peak detection voltage 402, and a valley detection voltage 404, in accordance with certain aspects of the present disclosure. As illustrated, the peak detection voltage 402 at node 310 increases as the peaks of the voltage transient 220 continue to increase, and the valley detection voltage 404 at node 312 decreases as the troughs of the voltage transient 220 become more negative. For example, when the voltage at node 310 is lower than $V_{supply}$, the switch S1 is closed, and the peak detection voltage 402 tracks $V_{supply}$. When the voltage at node 310 is greater than $V_{supply}$, the switch S1 is open, and the peak detection voltage 402 no longer tracks $V_{supply}$. Rather, the peak detection voltage 402 decreases at a rate corresponding to the current being sunk from the capacitor 302 by the current source 306.

Similarly, when the voltage at node 312 is greater than $V_{supply}$, the switch S2 is closed, and the valley detection voltage 404 (e.g., the voltage at node 312) tracks $V_{supply}$. When the voltage at node 312 is lower than $V_{supply}$ (more negative), the switch S2 is open, and the valley detection voltage 404 no longer tracks $V_{supply}$. Rather, the valley detection voltage 404 increases at a rate corresponding to the current being sourced to the capacitor 304 by the current source 308. Thus, the difference between the peak detection voltage 402 and valley detection voltage 404 represents the envelope of the voltage transient 220.

Returning to FIG. 3, the peak detection voltage and the valley detection voltage at nodes 310 and 312, respectively, are provided to a differential circuit 324, and the difference between the peak detection voltage and the valley detection voltage may be compared with a threshold voltage to determine whether to enable the post-regulation power stage 214. For example, the output of the differential circuit 324 may be coupled to a positive input terminal of a comparator 326 (e.g., an amplifier), and the negative input terminal of the comparator 326 may be coupled to a reference voltage node for providing a reference voltage Vref, as illustrated. When the output signal generated at the output terminal of the comparator 326 is logic high, the post-regulation power stage 214 is enabled to attenuate the detected transient. For example, when the difference between the peak detection voltage 402 and the valley detection voltage 404 is greater than the reference voltage (threshold voltage), the post-regulation enable signal 406 is logic high, as illustrated in FIG. 4, indicating that the post-regulation power stage 214 is to be enabled. Thus, a gate driver circuit 250 may receive the post-regulation enable signal 406 and drive the gate of the transistor 240 when the post-regulation enable signal 406 transitions from logic low to logic high. When the post-regulation enable signal 406 transitions to logic low, the gate driver circuit 250 disables the post-regulation power stage 214 to reduce the power consumption of the voltage regulation circuit 200. For example, the gate driver circuit 250 may disable the post-regulation power stage 214 by driving the gate of the transistor 240, such that the transistor 240 is in a saturation region of operation.

Figure 5:
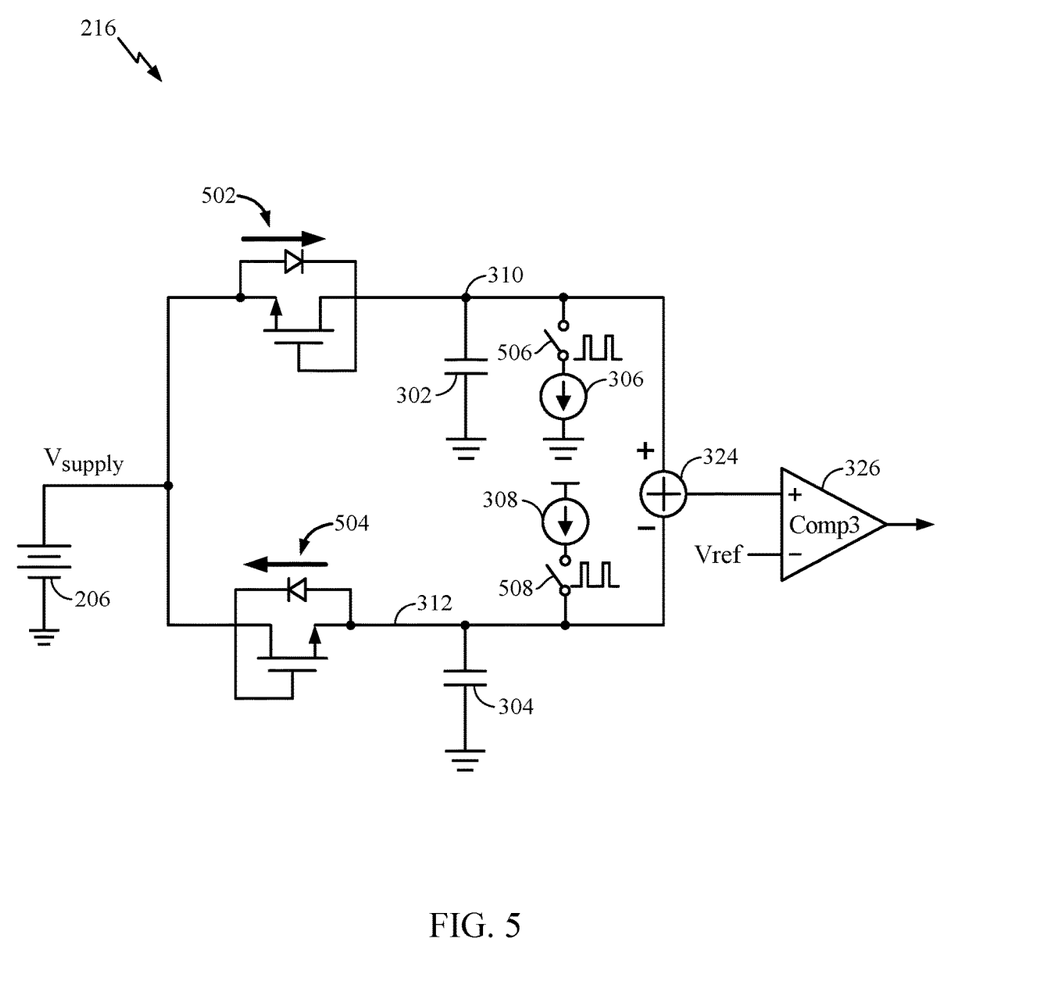
FIG. 5 illustrates another example implementation of the envelope detector, in accordance with certain aspects of the present disclosure.

FIG. 5 illustrates another example implementation of the envelope detector 216 employing diode devices as the unidirectional switches, in accordance with certain aspects of the present disclosure. In this case, the node 310 is coupled to a cathode of a diode device 502, and the anode of the diode device 502 is coupled to the input signal source 206. Likewise, the input signal source 206 is coupled to the cathode of a diode device 504, and the anode of the diode device 504 is coupled to the node 312. Thus, each of the diode devices 502 and 504 allows current to flow in one direction (e.g., from the input signal source 206 to the capacitor 302, and from the capacitor 304 to the input signal source 206). As illustrated, the diode devices 502 and 504 are implemented using diode-connected transistors (e.g., having the gate connected to the drain to utilize the body diode between the source and drain), but may also be implemented with diodes.

The envelope detector 216 of FIG. 5 also includes switches 506 and 508 that allow for fine-tuning of the currents sunk and sourced by respective current sources 306 and 308 by selectively coupling the current sources 306 and 308 to respective nodes 310 and 312. For example, the switches 506 and 508 may be controlled using a respective PWM signal generated at a duty-cycle signal node. The duty-cycle signal nodes may be coupled to respective control inputs of the switches 506 and 508, and the duty cycle of the PWM signal may be adjusted to fine-tune the current being sunk and sourced by respective current sources 306 and 308.

Figure 6:
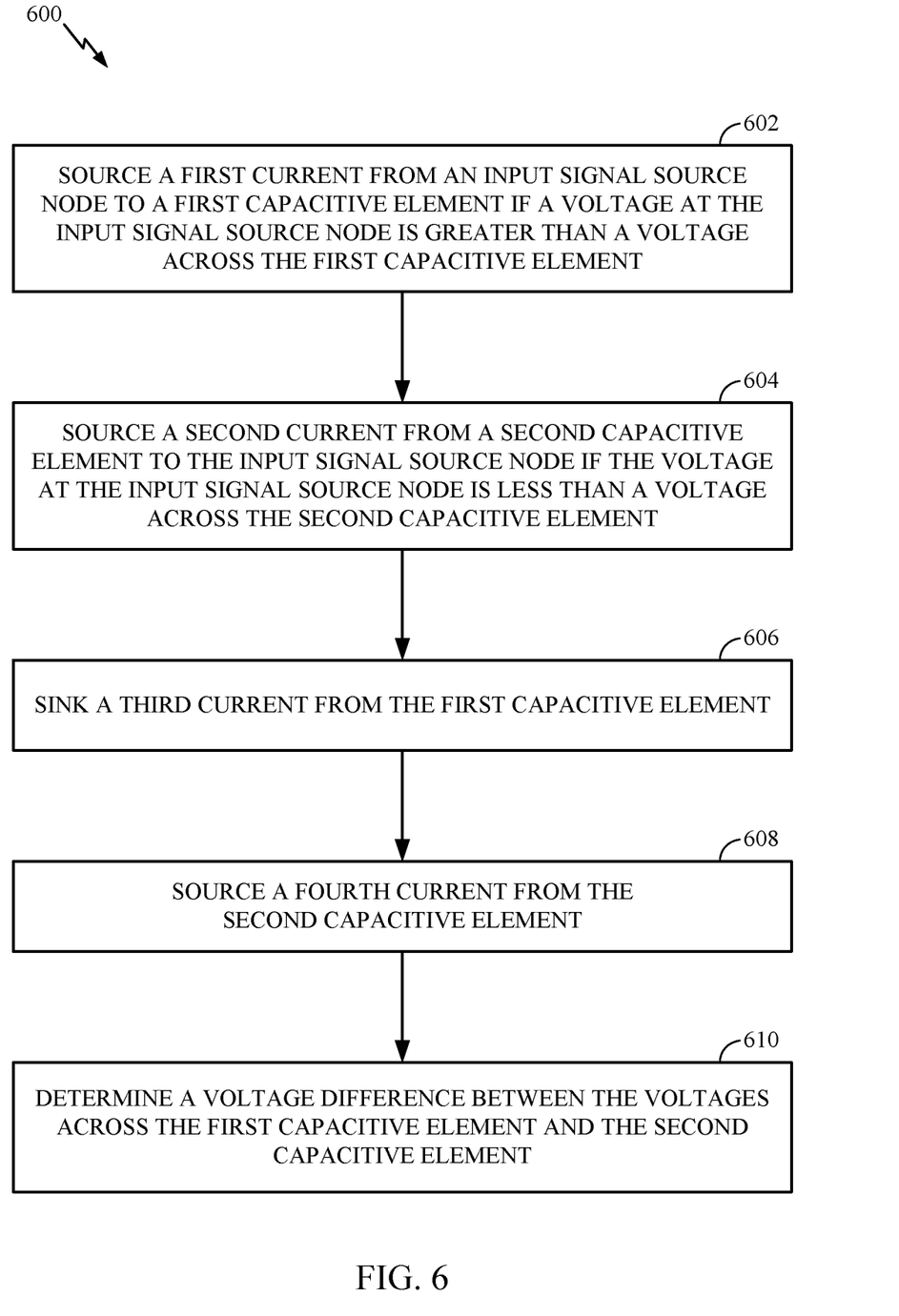
FIG. 6 is a flow diagram illustrating example operations for voltage ripple detection, in accordance with certain aspects of the present disclosure.

FIG. 6 is a flow diagram illustrating example operations 600 for voltage ripple detection, in accordance with certain aspects of the present disclosure. The operations 600 may be performed, for example, by a circuit, such as the circuits of FIGS. 2, 3, and 5.

The operations 600 may begin, at block 602, by sourcing a first current (e.g., via the switch S1 or the diode device 502) from an input signal source node (e.g., input signal source node 330) to a first capacitive element (e.g., capacitor 302) if a voltage at the input signal source node is greater than a voltage across the first capacitive element. At block 604, the circuit sources a second current (e.g., via the switch S2 or the diode device 504) from a second capacitive element (e.g., capacitor 304) to the input signal source node if the voltage at the input signal source node is less than a voltage across the second capacitive element. At optional block 606, the operations 600 may continue by (selectively) sinking a third current (e.g., via the current source 306 and, in some cases, switch 506) from the first capacitive element, and at optional block 608, (selectively) sourcing a fourth current (e.g., via the current source 308 and, in some cases, switch 508) from the second capacitive element. At block 610, a voltage difference between the voltages across the first capacitive element and the second capacitive element is determined (e.g., via the differential circuit 324).

In certain aspects, the operations 600 include determining (e.g., via the amplifier 320) whether the voltage at the input signal source node is greater than the voltage across the first capacitive element. In this case, sourcing the first current includes closing a switch (e.g., switch S1) coupled between the input signal source node and the first capacitive element based on the determination.

In certain aspects, the operations 600 include determining (e.g., via the amplifier 322) whether the voltage at the input signal source node is less than the voltage across the second capacitive element. In this case, sourcing the second current comprises closing a switch (e.g., switch S2) coupled between the input signal source node and the second capacitive element based on the determination.

In certain aspects, the operations 600 also include comparing (e.g., via the comparator 326) the voltage difference with a voltage threshold (e.g., Vref), and enabling (e.g., via the gate driver circuit 250) an attenuation circuit (e.g., post-regulation power stage 214) based on the determination. In certain aspects, the operations 600 also include regulating (e.g., via the SMPS 202) the voltage at the input signal source node to generate a regulated voltage, and attenuating (e.g., via the post-regulation power stage) the regulated voltage via the attenuation circuit when the attenuation circuit is enabled.

In certain aspects, the sinking the first current at block 606 comprises selectively sinking the first current, for example, by periodically coupling (e.g., via the switch 506) a first current source to the first capacitive element. In certain aspects, the sourcing the second current at block 608 comprises selectively sourcing the second current, for example, by periodically coupling (e.g., via the switch 508) a second current source to the second capacitive element.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for sourcing a first current may include a switch such as the switch S1. Means for sourcing a second current may include, for example, a switch such as the switch S2. Means for sinking a third current may include, for example, a current source such as the current source 306 and, in some cases, a switch such as the switch 506. Means for sourcing a fourth current may include, for example, a current source such as the current source 308 and, in some cases, a switch such as the switch 508. Means for determining may include, for example, a differential circuit such as the differential circuit 324 or an amplifier such as the amplifier 320 or amplifier 322.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A voltage transient detection circuit comprising:
a first switch having a first terminal coupled to an input signal source node;
a second switch having a first terminal coupled to the input signal source node;
a first shunt capacitive element coupled to a second terminal of the first switch;
a second shunt capacitive element coupled to a second terminal of the second switch;
a differential circuit having a first input coupled to the second terminal of the first switch, a second input coupled to the second terminal of the second switch, and an output coupled to an output node of the voltage transient detection circuit; and
an amplifier having a positive input terminal coupled to the output node of the voltage transient detection circuit and a negative input terminal coupled to a reference voltage node, wherein the voltage transient detection circuit is part of a voltage regulator circuit configured to enable a post-regulation power stage coupled to an output of a switched-mode power supply based on an output signal of the amplifier, the switched-mode power supply having an input coupled to the input signal source node.

2. The voltage transient detection circuit of claim 1, further comprising:
a first current source coupled to the first shunt capacitive element; and
a second current source coupled to the second shunt capacitive element.

3. The voltage transient detection circuit of claim 2, wherein the first current source is configured to sink current from the first shunt capacitive element, and wherein the second current source is configured to source current to the second shunt capacitive element.

4. The voltage transient detection circuit of claim 1, wherein the differential circuit is configured to provide a signal representing a difference between voltages at the second terminal of the first switch and the second terminal of the second switch to the output node of the voltage transient detection circuit.

5. The voltage transient detection circuit of claim 1, further comprising:
a first amplifier having a positive input terminal coupled to the input signal source node, a negative input terminal coupled to the second terminal of the first switch, and an output terminal coupled to a control terminal of the first switch; and
a second amplifier having a negative input terminal coupled to the input signal source node, a positive input terminal coupled to the second terminal of the second switch, and an output terminal coupled to a control terminal of the second switch.

6. The voltage transient detection circuit of claim 1, wherein the post-regulation power stage comprises a transistor having a source coupled to the output of the switched-mode power supply, and a drain coupled to an output of the voltage regulator circuit.

7. The voltage transient detection circuit of claim 1, wherein the switched-mode power supply comprises a boost converter.

8. The voltage transient detection circuit of claim 1, wherein the first switch comprises a diode having an anode coupled to the input signal source node and a cathode coupled to the first shunt capacitive element, and wherein the second switch comprises another diode having a cathode coupled to the input signal source node and an anode coupled to the second shunt capacitive element.

9. The voltage transient detection circuit of claim 8, wherein the diode comprises a diode-connected transistor, and wherein the other diode comprises another diode-connected transistor.

10. The voltage transient detection circuit of claim 2, further comprising:
a third switch coupled between the first current source and the first shunt capacitive element; and
a fourth switch coupled between the second current source and the second shunt capacitive element.

11. The voltage transient detection circuit of claim 10, wherein a control input of the third switch is coupled to a duty-cycle signal node, and wherein a control input of the fourth switch is coupled to another duty-cycle signal node.

12. A method for voltage transient detection, comprising:
sourcing a first current from an input signal source node to a first capacitive element if a voltage at the input signal source node is greater than a voltage across the first capacitive element;
sourcing a second current from a second capacitive element to the input signal source node if the voltage at the input signal source node is less than a voltage across the second capacitive element; and
determining a voltage difference between the voltages across the first capacitive element and the second capacitive element.

13. The method of claim 12, further comprising:
determining whether the voltage at the input signal source node is greater than the voltage across the first capacitive element, wherein sourcing the first current comprises closing a switch coupled between the input signal source node and the first capacitive element based on the determination.

14. The method of claim 12, further comprising:
determining whether the voltage at the input signal source node is less than the voltage across the second capacitive element, wherein sourcing the second current comprises closing a switch coupled between the input signal source node and the second capacitive element based on the determination.

15. The method of claim 12, further comprising:
comparing the voltage difference with a voltage threshold; and
enabling an attenuation circuit based on the determination.

16. The method of claim 15, further comprising:
regulating the voltage at the input signal source node to generate a regulated voltage; and
attenuating the regulated voltage via the attenuation circuit when the attenuation circuit is enabled.

17. The method of claim 12, further comprising:
sinking a third current from the first capacitive element; and
sourcing a fourth current from the second capacitive element.

18. The method of claim 12, wherein:
sinking the first current comprises selectively sinking the first current by periodically coupling a first current source to the first capacitive element; and
sourcing the second current comprises selectively sourcing the second current by periodically coupling a second current source to the second capacitive element.

19. An apparatus for voltage transient detection, comprising:
means for sourcing a first current from an input signal source node to a first capacitive element if a voltage at the input signal source node is greater than a voltage across the first capacitive element;
means for sourcing a second current from a second capacitive element to the input signal source node if the voltage at the input signal source node is less than a voltage across the second capacitive element; and
means for determining a voltage difference between the voltages across the first capacitive element and the second capacitive element.

20. The apparatus of claim 19, further comprising:
means for sinking a third current from the first capacitive element; and
means for sourcing a fourth current from the second capacitive element.

21. The apparatus of claim 20, further comprising:
means for determining whether the voltage at the input signal source node is greater than the voltage across the first capacitive element, wherein the means for sourcing the first current comprises a switch coupled between the input signal source node and the first capacitive element and controlled by the means for determining.

22. The apparatus of claim 20, further comprising:
means for determining whether the voltage at the input signal source node is less than the voltage across the second capacitive element, wherein the means for sourcing the second current comprises a switch coupled between the input signal source node and the second capacitive element and controlled by the means for determining.

23. A voltage regulation circuit, comprising:
a voltage regulator having an input coupled to a voltage supply;
a post-regulation power stage coupled to an output of the voltage regulator; and
an envelope detector comprising:
a first switch having a first terminal coupled to the voltage supply;
a second switch having a first terminal coupled to the voltage supply;
a first shunt capacitive element coupled to a second terminal of the first switch; and
a second shunt capacitive element coupled to a second terminal of the second switch
wherein the envelop detector is configured to:
detect a peak voltage and a valley voltage of a voltage of the voltage supply; and
selectively enable the post-regulation power stage based on a difference between the detected peak voltage and the detected valley voltage exceeding a voltage threshold.

24. The voltage regulation circuit of claim 23, wherein the post-regulation power stage is configured to attenuate an output voltage of the voltage regulator.

25. The voltage regulation circuit of claim 23, wherein:
the first switch and the first shunt capacitive element are configured to detect the peak voltage; and
the second switch and the second shunt capacitive element are configured to detect the valley voltage.

26. The voltage regulation circuit of claim 23, further comprising:
a first current source selectively coupled to the first shunt capacitive element, the first current source being configured to sink a current from the first shunt capacitive element; and
a second current source selectively coupled to the second shunt capacitive element, the second current source being configured to source a current to the second shunt capacitive element.

* * * * *